(12) United States Patent
Kusunoki

(10) Patent No.: US 6,480,705 B1
(45) Date of Patent: Nov. 12, 2002

(54) DISTORTION COMPENSATION METHOD AND WIRELESS COMMUNICATION APPARATUS

(75) Inventor: Shigeo Kusunoki, Kanagawa (JP)

(73) Assignee: Sony Corporation, Tokyo (JP)

( * ) Notice: Subject to any disclaimer, the term of this patent is extended or adjusted under 35 U.S.C. 154(b) by 133 days.

(21) Appl. No.: 09/609,425

(22) Filed: Jul. 5, 2000

(30) Foreign Application Priority Data

Jul. 9, 1999 (JP) .............................................. 11-195317

(51) Int. Cl.[7] .............................. H04B 1/04; H04G 3/20; H03F 1/26
(52) U.S. Cl. ..................... 455/126; 455/234.1; 455/114; 455/127; 330/136; 330/149
(58) Field of Search ................................. 455/126, 127, 455/232.1, 234.1, 240.1, 239.1, 241.1, 114–115, 63, 67.3; 330/136, 149, 129; 375/295, 296, 214

(56) References Cited

U.S. PATENT DOCUMENTS

| 3,486,128 A | * | 12/1969 | Lohrmann | 330/129 |
| 3,789,236 A | * | 1/1974 | Lacroix | 307/96 |
| 3,900,823 A | * | 8/1975 | Sokai et al. | 330/149 |
| 4,276,514 A | * | 6/1981 | Huang | 330/149 |
| 5,121,081 A | * | 6/1992 | Hori | 330/279 |
| 5,376,895 A | * | 12/1994 | Aihara | 330/129 |
| 5,606,285 A | * | 2/1997 | Wang et al. | 330/134 |
| 5,697,074 A | * | 12/1997 | Makikallio et al. | 455/126 |
| 5,712,593 A | * | 1/1998 | Buer et al. | 330/129 |

* cited by examiner

Primary Examiner—Vivian Chin
Assistant Examiner—Duc Nguyen
(74) Attorney, Agent, or Firm—Jay H. Maioli

(57) ABSTRACT

An apparatus and method for distortion compensation of a high frequency power amplification section wherein a finite difference between envelopes of input and output signals of an amplifier of an object of distortion compensation is detected, and variation of a temperature and other parameters is suppressed using a component which originates from an offset of the finite difference. Further, a component of the finite difference which originates from the distortion is added to the input signal of the amplifier to effect distortion compensation.

4 Claims, 9 Drawing Sheets

DISTORTION COMPENSATION METHOD AND WIRELESS COMMUNICATION APPARATUS

BACKGROUND OF THE INVENTION

This invention relates to a method of compensating for a nonlinear distortion of a power amplifier of a transmission section of a wireless communication apparatus, and a wireless communication apparatus which compensates for a nonlinear distortion of a power amplifier of a transmission section.

In a digital wireless communication apparatus at present, the demand for linearity of a power amplifier for transmission becomes severe as increase of the speed and capacity of communication proceeds. However, if the demand for linearity of a power amplifier becomes severe, then the power efficiency of the power amplifier decreases, and this prevents, for example, elongation of the time within which a terminal telephone set of a digital portable telephone system can enjoy a continuous service. Therefore, it has been proposed to compensate for a nonlinear distortion of a power amplifier to augment the power efficiency of the power amplifier.

FIG. 14 illustrates a conventional distortion compensation method disclosed in Japanese Patent No. 2,689,011, "Linear Transmission Apparatus". Referring to FIG. 14, an input signal Si of a modulated wave from an input terminal 101 is inputted to a power amplifier 91 through a directional coupler 92 and a power control circuit 93. An output signal of the power amplifier 91 is led out as an output signal So to an output terminal 102 through another directional coupler 94.

Then, the input signal Si is branched by the directional coupler 92 and supplied to an envelope detection circuit 95, by which an envelope of the input signal Si is detected. The envelope detection signal of the envelope detection circuit 95 is supplied to a dc voltage conversion circuit 96, by which a dc voltage from a power supply terminal 103 is converted in accordance with the envelope of the input signal Si. A dc voltage after the conversion of the dc voltage conversion circuit 96 is supplied as a power supply voltage to the power amplifier 91.

Further, the output signal So is branched by the directional coupler 94 and supplied to another envelope detection circuit 97, by which an envelope of the output signal So is detected. The envelope detection signal of the envelope detection circuit 97 is supplied together with the envelope detection signal from the envelope detection circuit 95 to a difference signal production circuit 98. The difference signal production circuit 98 produces a signal of a difference between the envelope of the input signal Si and the envelope of the output signal So. The difference signal of the difference signal production circuit 98 is supplied through a dc amplifier 99 to the power control circuit 93. The power control circuit 93 controls the input power of the power amplifier 91 in accordance with the difference between the envelope of the input signal Si and the envelope of the output signal So.

According to this method, the power supply voltage of the power amplifier 91 is controlled in accordance with the envelope of the input signal Si to decrease a nonlinear distortion of the input signal Si, and the input power of the power amplifier 91 is controlled in accordance with the difference between the envelope of the input signal Si and the envelope of the output signal So to absorb a gain variation of the power amplifier 91 which is caused by a temperature variation or the like.

With the conventional distortion compensation method described above, however, since the power supply voltage of the power amplifier 91 is modulated by the dc voltage conversion circuit 96 to amplitude modulate the signal to be amplified by the power amplifier 91, there is a drawback that a distortion by the modulation is produced. Besides, since the power supply voltage of the power amplifier 91 is modulated in accordance with the envelope of the input signal Si, there is another drawback that a nonlinear distortion which cannot be detected from the envelope of the input signal Si and does not rely upon the power supply voltage of the power amplifier 91, for example, a distortion which originates from a nonlinear parameter such as a parasitic capacitance Cgs between the gate and the source of a GaAs FET which forms the power amplifier 91, cannot be reduced.

SUMMARY OF THE INVENTION

It is an object of the present invention to provide a distortion compensation method and a wireless communication apparatus which can reduce a nonlinear distortion of a power amplifier without producing a distortion by modulation and reduce a nonlinear distortion, which cannot be detected from an envelope of an input signal and does not rely upon the power supply voltage of the power amplifier, with certainty.

In order to attain the object described above, according to the present invention, there is provided a distortion compensation method for compensating for a nonlinear distortion of a power amplifier, comprising a detection step of detecting envelopes of an input signal and an output signal of the power amplifier individually, and an addition step of adding a signal corresponding to a finite difference between the detection signals of the envelopes obtained by the detection step to the input signal of the power amplifier.

In the distortion compensation method, not a signal obtained by modulating a power supply voltage of the power amplifier and amplifying the modulated power supply voltage by the power amplifier is amplitude modulated, but a signal for compensation is added to an input signal of the power amplifier. Consequently, a nonlinear distortion of the power amplifier can be reduced without production of a distortion by modulation. Besides, since a signal corresponding to a finite difference between an envelope of the input signal and an envelope of an output signal of the power amplifier is added as the signal for compensation, also a nonlinear distortion which cannot be detected from the envelope of the input signal and does not rely upon the power supply voltage of the power amplifier can be reduced with certainty.

The above and other objects, features and advantages of the present invention will become apparent from the following description and the appended claims, taken in conjunction with the accompanying drawings in which like parts or elements denoted by like reference symbols.

DETAILED DESCRIPTION OF THE PREFERRED EMBODIMENT

Figure 1:
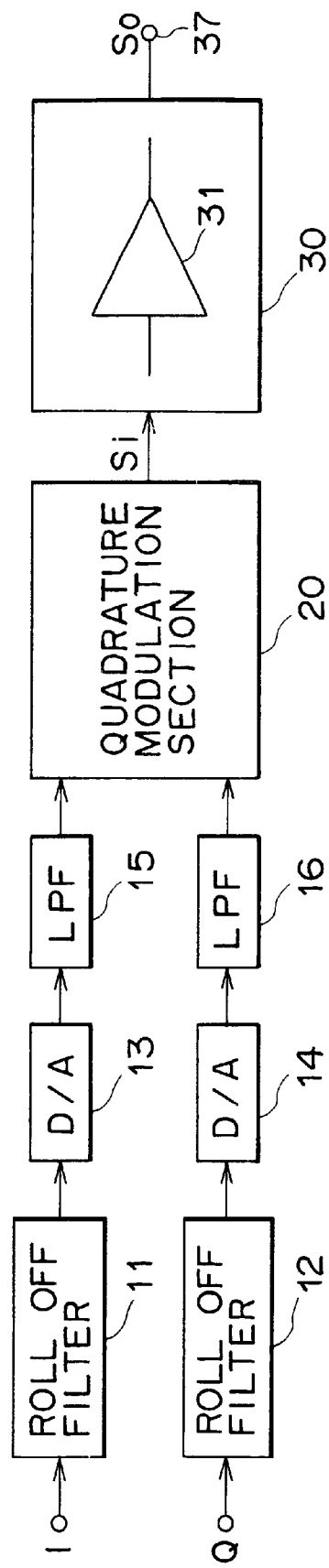
FIG. 1 is a block diagram showing an example of a wireless communication apparatus of the present invention.

FIG. 1 shows an example of a wireless communication apparatus of the present invention. More particularly, FIG. 1 shows an example of a wireless communication apparatus wherein a nonlinear distortion of a power amplifier of a transmission section is compensated for by a distortion compensation method of the present invention. The wireless communication apparatus shown in FIG. 1 is formed as a terminal telephone set of a digital portable telephone system.

Referring to FIG. 1, in the wireless communication apparatus shown, digital quadrature baseband signals I and Q are supplied through roll off filters 11 and 12 to D/A converters 13 and 14, respectively, by which they are converted into analog signals. The analog quadrature baseband signals obtained by the D/A converters 13 and 14 are supplied through low-pass filters 15 and 16 to a quadrature modulation section 20, respectively. Consequently, a quadrature modulated high frequency signal Si is obtained by the quadrature modulation section 20. The high frequency signal Si is amplified by a high frequency power amplifier 31 of a high frequency power amplification section 30 so that a transmission high frequency signal So is obtained at an output terminal 37. Further, a nonlinear distortion of the high frequency power amplifier 31 is compensated for in the following manner by the high frequency power amplification section 30. In the following, the high frequency power amplifier 31 is referred to simply as power amplifier 31.

Figure 2:
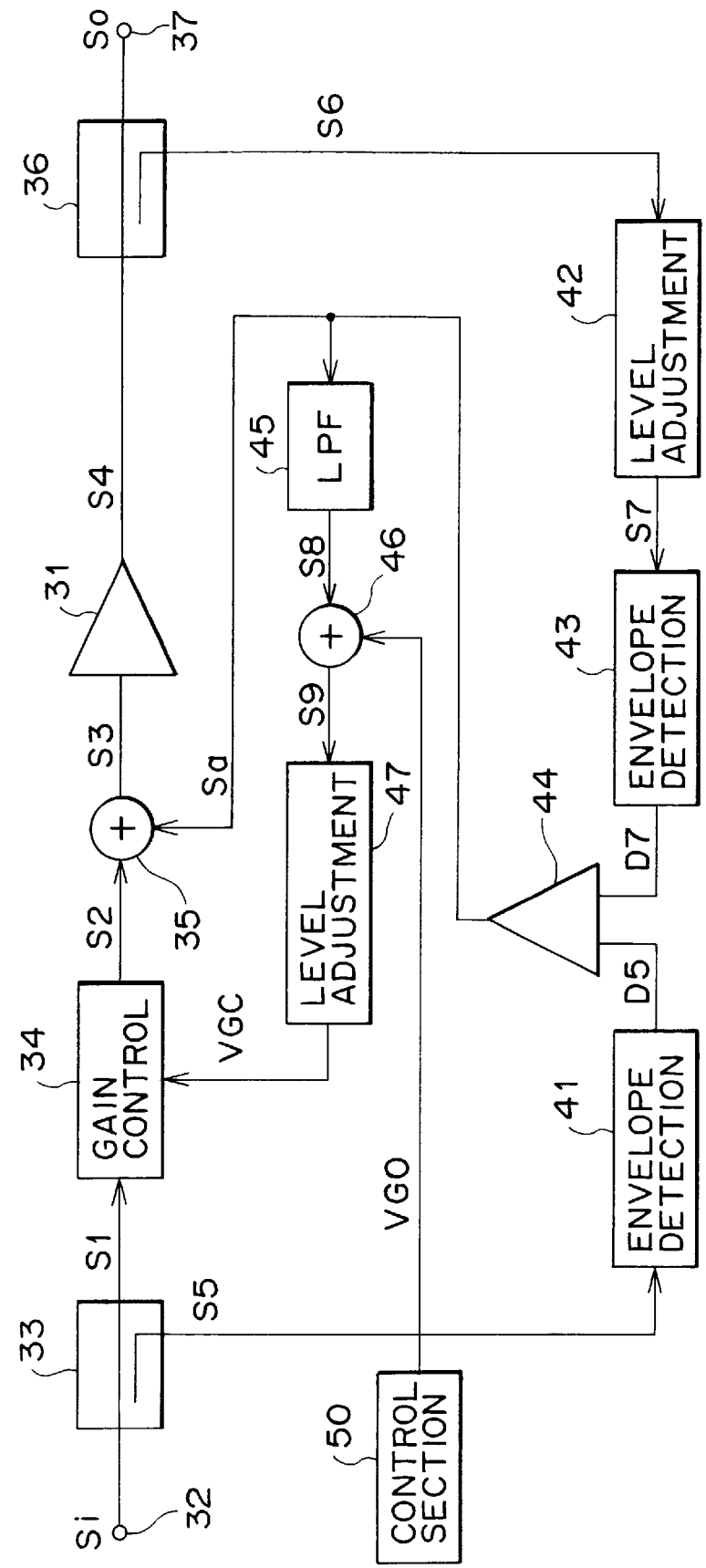
FIG. 2 is a block diagram showing an example of a high frequency power amplification section shown in FIG. 1.

FIG. 2 shows a form of the high frequency power amplification section 30. Referring to FIG. 2, in the high frequency power amplification section 30 shown, the input high frequency signal Si from the quadrature modulation section 20 of FIG. 1 is supplied to an input terminal 32 and branched to input high frequency signals S1 and S5 by a directional coupler 33. The input high frequency signal Si is inputted to a gain control circuit 34. An addition circuit 35 on the output side of the gain control circuit 34 adds a finite difference signal Sa from a comparator 44 which is hereinafter described to a high frequency signal S2 from the gain control circuit 34. A high frequency signal S3 from the addition circuit 35 is amplified by the power amplifier 31.

A high frequency signal S4 of an output of the power amplifier 31 is branched to two output high frequency signals So and S6 by a directional coupler 36. The output high frequency signal So is extracted as a transmission high frequency signal to the output terminal 37.

The other input high frequency signal S5 branched by the directional coupler 33 is supplied to an envelope detection circuit 41, by which an envelope of the high frequency signal S5 is detected. Then, an envelope detection signal D5 of the envelope detection circuit 41 is supplied to one of a pair of input terminals of the comparator 44. Meanwhile, the level of the other output high frequency signal S6 branched by the directional coupler 36 is adjusted in such a manner as hereinafter described by a level adjustment circuit 42. Then, a high frequency signal S7 after the adjustment by the level adjustment circuit 42 is supplied to another envelope detection circuit 43, by which an envelope of the high frequency signal S7 is detected. Then, an envelope detection signal D7 of the envelope detection circuit 43 is supplied to the other input terminal of the comparator 44.

Consequently, a signal Sa of a finite difference between the input envelope detection signal D5 and the output envelope detection signal D7 is obtained from the comparator 44. As described hereinabove, the finite difference signal Sa is added to the high frequency signal S2 from the gain control circuit 34 by the addition circuit 35.

Further, the finite difference signal Sa is supplied to a low-pass filter 45, from which a component of a low frequency in the finite difference signal Sa is extracted. Then, a signal S8 from the low-pass filter 45 is added to a gain control signal VGO from a control section 50 by an addition circuit 46, and the level of a signal S9 from the addition circuit 46 is adjusted by a level adjustment circuit 47. Then, the gain of the gain control circuit 34 is controlled in the following manner with a gain control signal VGC after the adjustment of the level adjustment circuit 47.

[Operation of the Gain Control]

In the high frequency power amplification section 30 described above, the gain thereof is kept fixed irrespective of variation of an environmental parameter such as the temperature or the power supply voltage.

The input high frequency signals Si, S1 and S5 and the input envelope detection signal D5 are signals free from distortion. The output high frequency signals So, S6 and S7 and the output envelope detection signal D7 are signals which have only a nonlinear distortion of the power amplifier 31 if such environmental parameters as the temperature and the power supply voltage do not vary.

If an environmental parameter varies, then since the gain of the power amplifier 31 varies, the output high frequency signals So, S6 and S7 and the output envelope detection signal D7 become signals which include, in addition to a distortion component, an offset component of a level which originates from the gain variation of the power amplifier 31. However, the level adjustment circuit 42 is set so that the input envelope detection signal D5 and the output envelope detection signal D7 may have an equal level under certain environmental parameters.

Accordingly, the finite difference signal Sa from the comparator 44 includes only a component included in the output envelope detection signal D7 if environmental parameters do not vary, but if an environmental parameter varies, then the finite difference signal Sa becomes a sum of the distortion component mentioned and the offset component described above.

From the low-pass filter 45, only the component of the finite difference signal Sa which has a low frequency, that is, the offset component described above originating from a variation of an environmental parameter, is extracted as a signal S8. However, a component of the finite difference signal Sa which has a high frequency, that is, an envelope variation component of the distortion component, is cut off. Naturally, if the environmental parameters do not vary, then the signal S8 is zero.

Then, in the high frequency power amplification section 30, the gain of the gain control circuit 34 is controlled with the gain control signal VGC obtained by adding the signal S8 from the low-pass filter 45 to the gain control signal VGO from the control section 50 so that the signal S8 as the offset component originating from the variation of the environmental parameter may be zero.

Accordingly, irrespective of variation of an environmental parameter such as a temperature or a power supply voltage, the gain of the high frequency power amplification section 30 is kept fixed. In particular, although the gain of the power amplifier 31 is varied by variation of an environmental parameter, since the gain of the gain control circuit 34 varies by an equal amount in the opposite direction in response to the variation of the gain, the gain of the high frequency power amplification section 30 including the power amplifier 31 and the gain control circuit 34 is kept fixed. As a result, the variation of the gain of the power amplifier 31 is cancelled.

Further, in the high frequency power amplification section 30 described above, a nonlinear distortion of the power amplifier 31 is compensated for as described below.

Figure 3A:
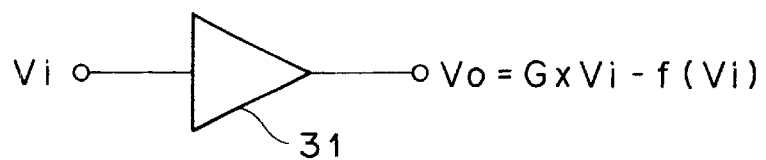
FIGS. 3A and 3B are circuit diagrams illustrating reduction of a nonlinear distortion of a power amplifier by a method of the present invention.

Referring to FIG. 3A, the input voltage of the power amplifier 31 is represented by Vi, the output voltage is represented by Vo, and the linear gain is represented by G (times). Since the power amplifier 31 has only a nonlinear distortion, amplitude suppression occurs in a high output power region. The suppression amount can be represented by f(Vi) because it relies upon the input voltage Vi. Accordingly, the output voltage Vo is represented, also as seen in FIG. 3A, by $$Vo = G \times Vi - f(Vi) \quad (1)$$

Figure 3B:
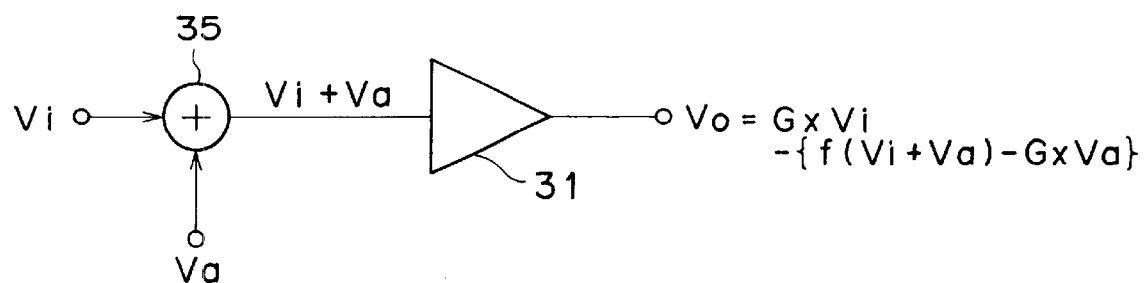

In order to make up for this amplitude suppression –f(Vi), in the high frequency power amplification section 30 of FIG. 2, the signal Sa is added to the input high frequency signal S2 by the addition circuit 35 on the input side of the power amplifier 31. Accordingly, where the increasing amount of the input voltage of the power amplifier 31 by the addition of the signal Sa is represented by Va, the output voltage of the power amplifier 31 when the signal Sa is added is represented by, as seen also in FIG. 3B, $$Vo = G \times (Vi + Va) - f(Vi + Va) \quad (2)$$
$$= G \times Vi - \{f(Vi + Va) - G \times Va\}$$

Here, if f(Vi) and {f(Vi+Va)–G×Va} of the second terms of the expression (1) and the expression (2) have a relationship of $$f(Vi) > \{f(Vi+Va) - G \times Va\} \quad (3)$$

then the amplitude suppression is moderated by the addition of the signal Sa, and the nonlinear distortion of the high frequency power amplification section 30 is reduced.

Then, in the high frequency power amplification section 30, a signal given by G'Va>{f(Vi+Va)–f(Vi)} which is a finite difference between the input envelope detection signal D5 and the output envelope detection signal D7 from the comparator 44 is added so that the relationship of the expression (3) is satisfied, and the amplitude suppression is moderated and the nonlinear distortion is reduced.

In this instance, since the signal Sa is added to the input high frequency signal S2 of the power amplifier 31, different from another case wherein a power supply voltage of a power amplifier is modulated to amplitude modulate a high frequency signal, distortion by modulation does not occur. Besides, since the signal Sa of the finite difference between the input envelope detection signal D5 and the output envelope detection signal D7 is added as a signal for compensation, different from another case wherein a power supply voltage of a power amplifier is modulated in response to an input envelope detection signal, also a nonlinear distortion which cannot be detected from the input envelope detection signal D5 and does not rely upon the power supply voltage of the power amplifier 31, for example, a distortion which arises from a nonlinear parameter such as, for example, a parasitic capacitance Cgs between the gate and the source of a GaAs FET which forms the power amplifier 31, can be reduced with certainty.

Figure 4:
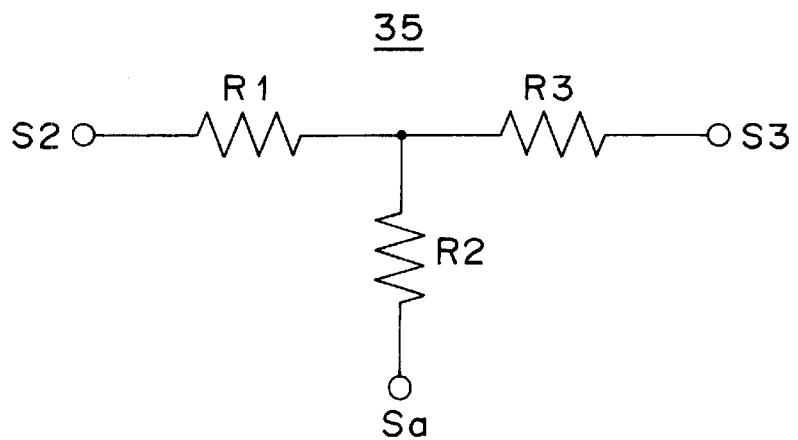
FIG. 4 is a circuit diagram showing an example of an addition circuit shown in FIG. 2.

The addition circuit 35 includes, for example, as shown in FIG. 4, three resistors R1, R2 and R3 connected in a star connection. With the construction, since the addition circuit 35 is composed only of passive elements, pure addition is performed, and production of a distortion by modulation can be prevented with a higher degree of certainty.

Figure 5:
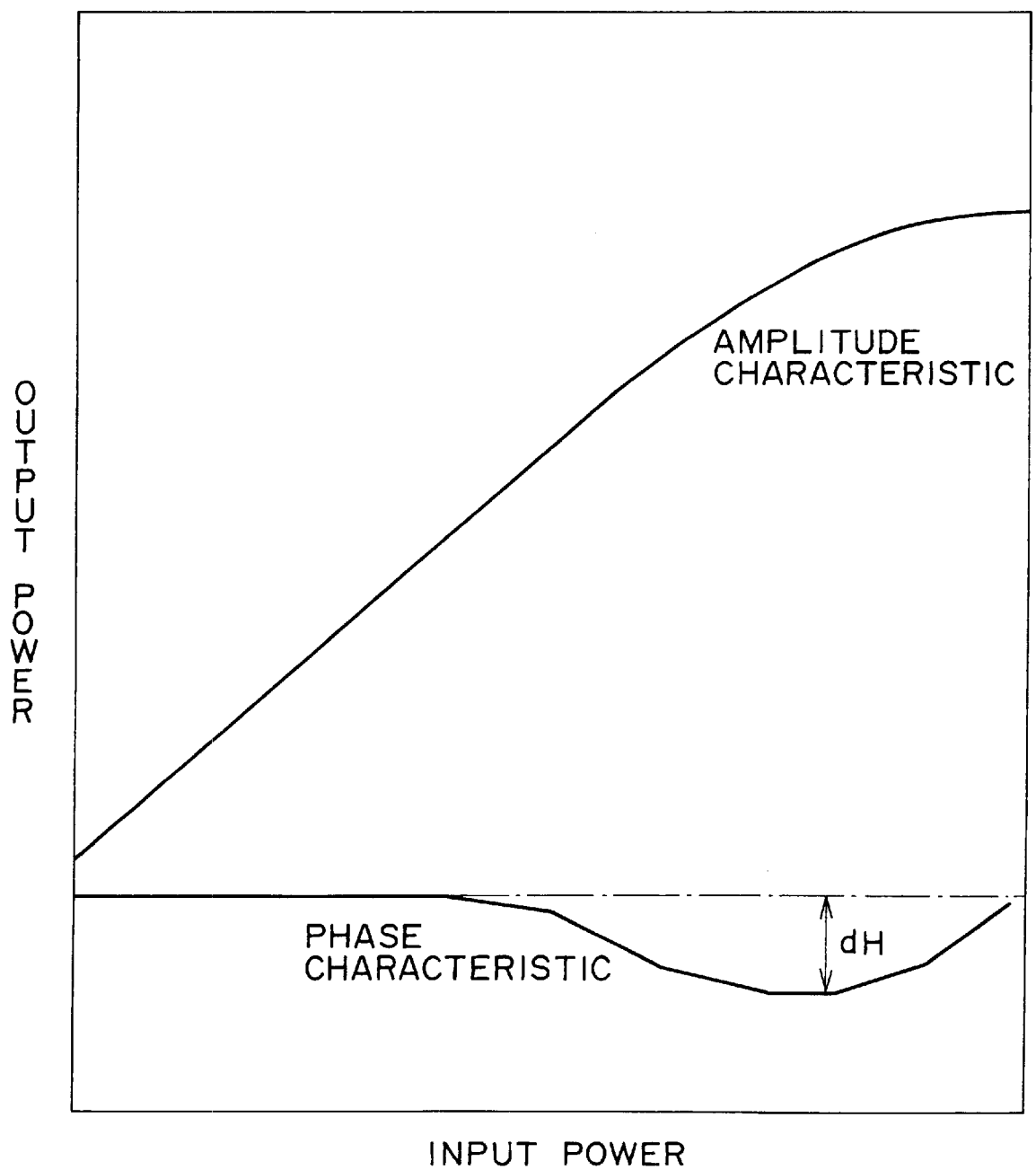
FIG. 5 is a diagrammatic view illustrating an amplitude phase characteristic of a power amplifier used for calculation of an output spectrum.
Figure 6:
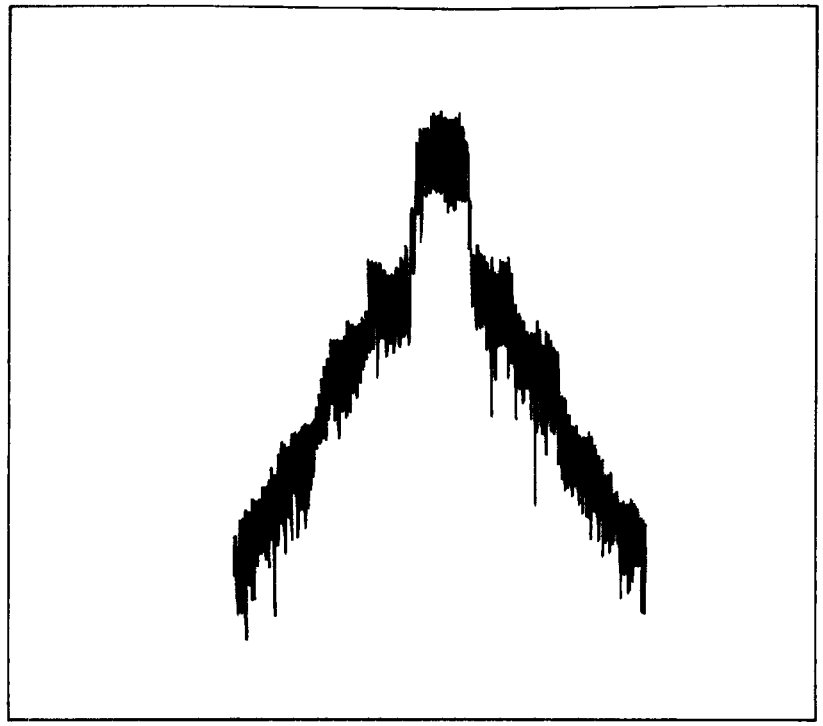
FIG. 6 is a diagrammatic view illustrating a result of output spectrum calculation where distortion compensation is not performed with a power amplifier of the characteristic of FIG. 5.

A result of calculation of an output spectrum of a power amplifier which is obtained by inputting a QPSK (Quadrature Phase Shift Keying) modulation signal to a power amplifier which has such an amplitude phase characteristic (amplitude phase distortion) as seen in FIG. 5 and has a maximum output power of 29.3 dBm, a low power gain of 26.1 dB and a maximum phase deviation dH of –5.2 degrees and includes distortion is illustrated in FIG. 6. In this instance, an adjacent channel leakage power ratio is –39 dBc.

Figure 7:
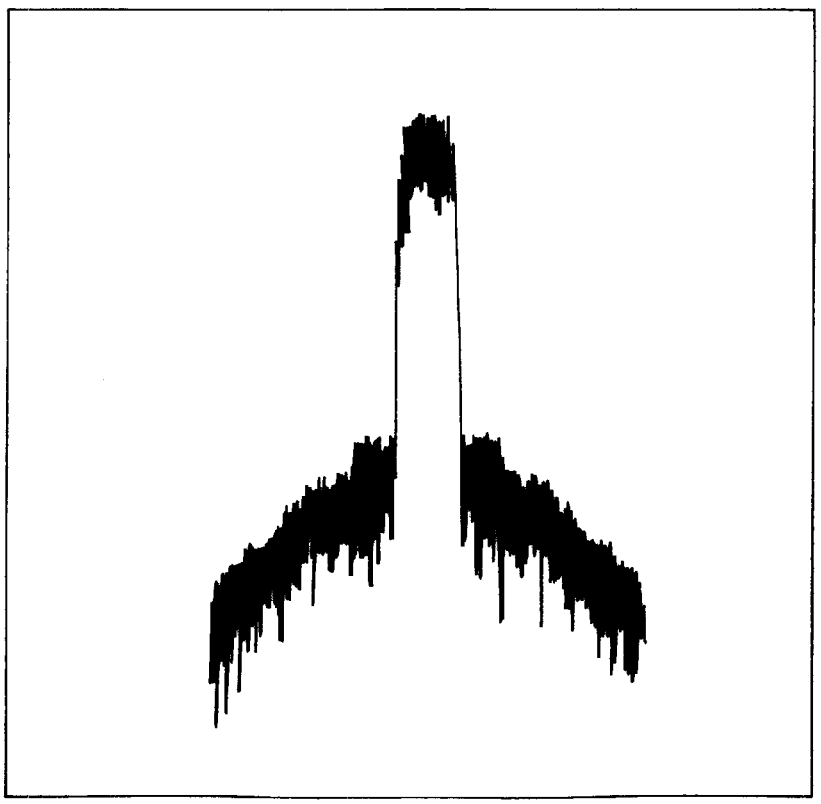
FIG. 7 is a diagrammatic view illustrating a result of output spectrum calculation where distortion compensation is performed in accordance with the method of the present invention with the power amplifier of the characteristic of FIG. 5.

In contrast, a result of calculation of an output spectrum of the power amplifier 31 obtained by inputting the QPSK modulation signal to which the finite difference signal Sa is added by the addition circuit 35 as described above using the same power amplifier as the power amplifier 31 is illustrated in FIG. 7. In this instance, the adjacent channel leakage power ratio is –88 dBc and exhibits augmentation by 49 dB when compared with that of another case wherein the distortion compensation of FIG. 6 is not performed.

Figure 8:
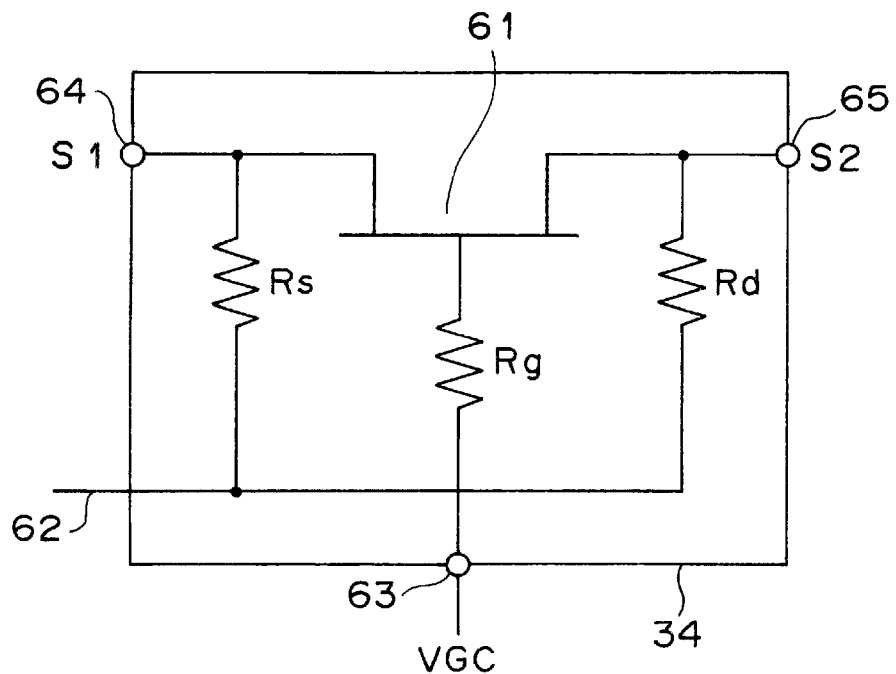
FIG. 8 is a circuit diagram showing an example of a gain control circuit shown in FIG. 2.

FIG. 8 shows an example of the gain control circuit 34 of FIG. 2 where it is formed as an attenuator which includes a FET.

Referring to FIG. 8, in the gain control circuit 34 shown, the source and the drain of a FET 61 are connected to a power supply line 62 of +3 V through resistors Rs and Rd, respectively. The gate of the FET 61 is connected through a resistor Rg to a terminal 63, to which the gain control signal VGC is supplied. The high frequency signal S1 is inputted to a terminal 64 led out from the source of the FET 61, and the high frequency signal S2 is outputted from a terminal 65 led out from the drain of the FET 61.

Figure 9:
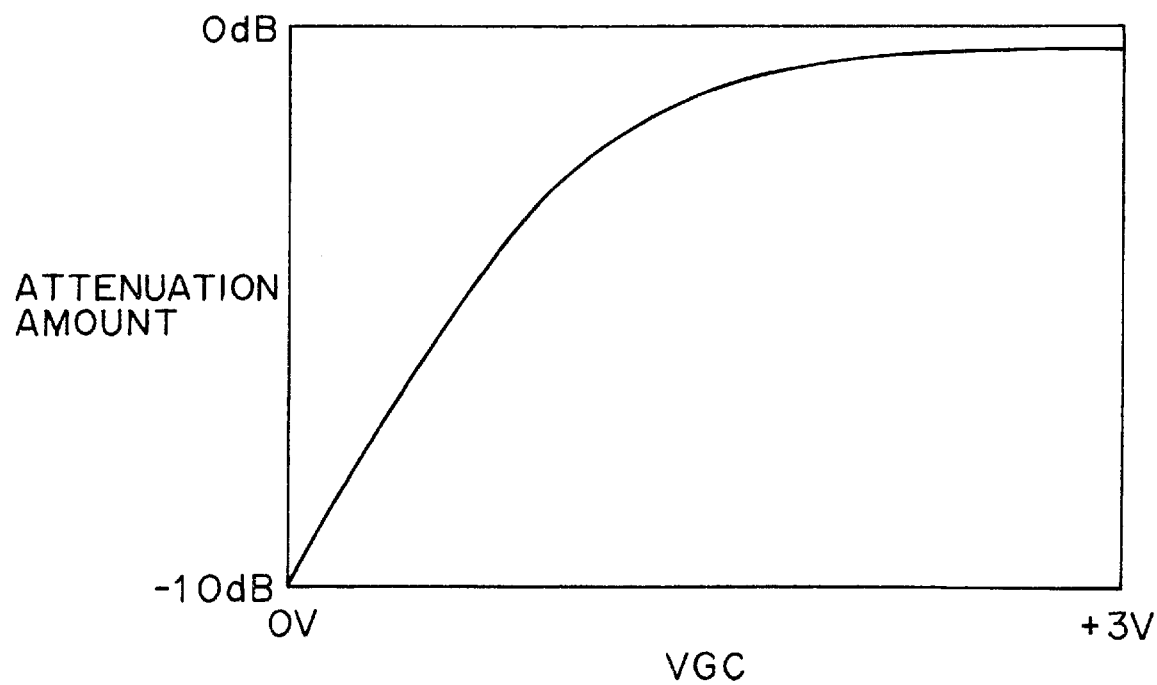
FIG. 9 is a diagram illustrating an example of a characteristic of the gain control circuit of FIG. 8.

In the gain control circuit 34, where a GaAs JFET having a gate width of 1 mm is used as the FET 61, such an attenuation characteristic as illustrated in FIG. 9 is obtained, and by varying the gain control signal VGC within a range from 0 V to +3 V, gain control over approximately 10 dB is possible.

Figure 10:
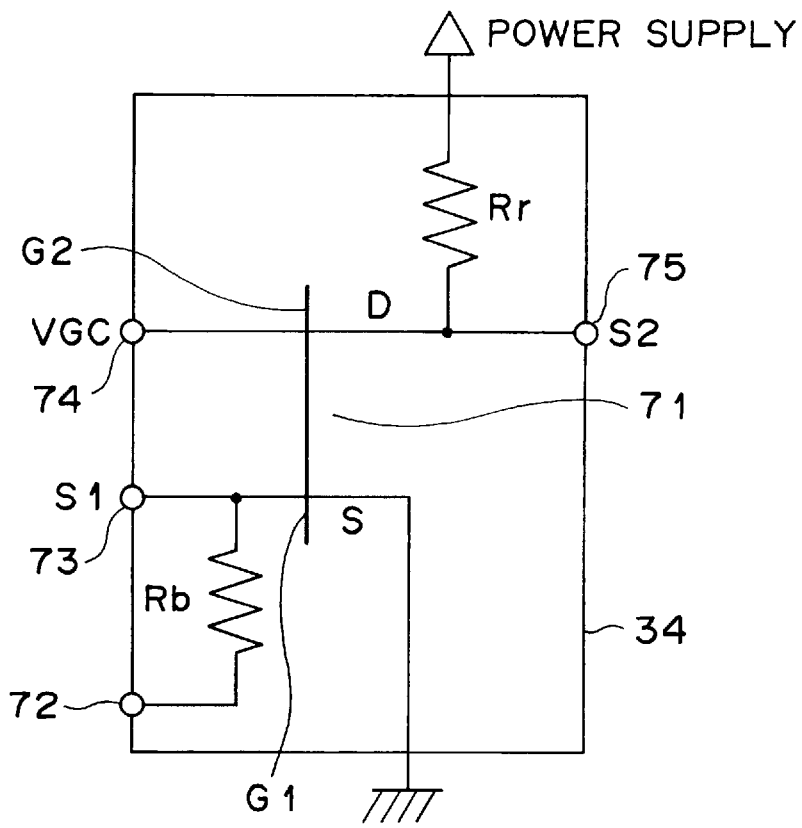
FIG. 10 is a circuit diagram showing another example of the gain control circuit shown in FIG. 2.

FIG. 10 shows another example of the gain control circuit 34 of FIG. 2 wherein a dual-gate FET is used.

Referring to FIG. 10, in the present gain control circuit 34, the first gate C1 of a dual gate FET 71 is connected through a resistor Rb to a terminal 72 to which a bias voltage Vb is supplied. The drain D of the dual gate FET 71 is connected to a power supply through a load resistor Rr. The high frequency signal S1 is inputted to a terminal 73 led out from the first gate G1 of the dual gate FET 71, and the gain control signal VGC is supplied to another terminal 74 led out from the second gate G2 of the dual gate FET 71. Further, the high frequency signal S2 is outputted from a further terminal 75 led out from the drain D of the dual gate FET 71. The source S of the dual gate FET 71 is grounded.

Figure 11:
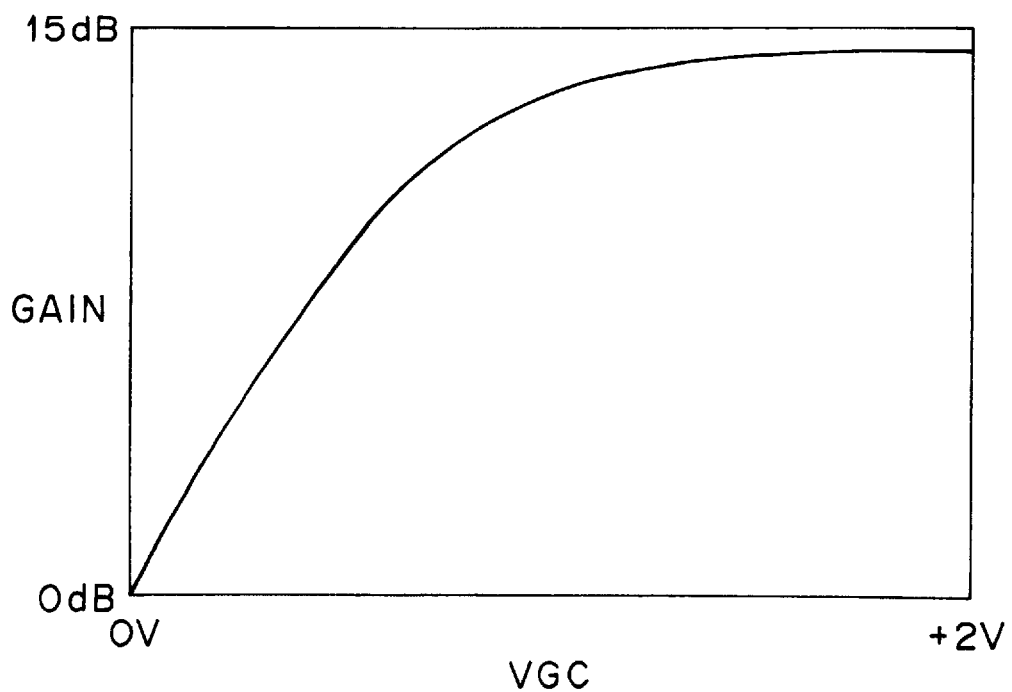
FIG. 11 is a diagram illustrating an example of a characteristic of the gain control circuit of FIG. 10.

If a GaAs JFET having a gate width of 200 µm is used as the dual gate FET 71 in the present gain control circuit 34, such a gain characteristic as illustrated in FIG. 11 is obtained, and by varying the gain control signal VGC within a range of 0 V to +2 V, gain control over approximate 15 dB is possible.

Figure 12:
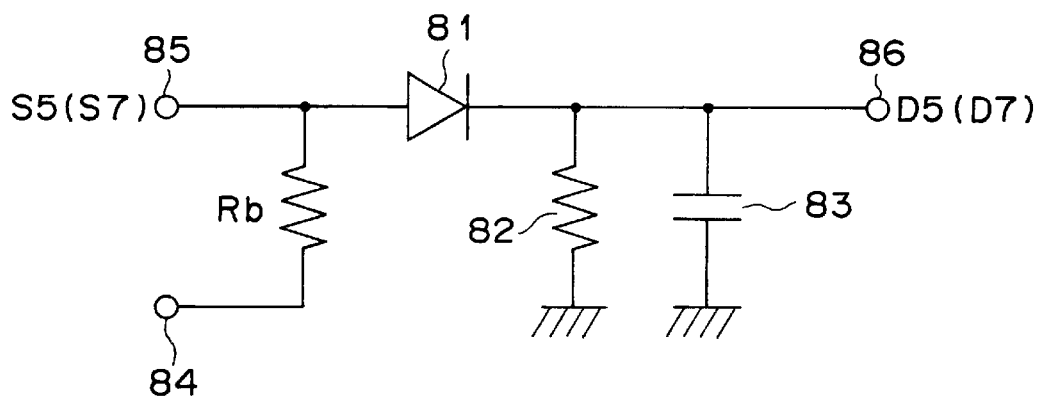
FIG. 12 is a circuit diagram showing an example of an envelope detection circuit shown in FIG. 2.

FIG. 12 shows an example of the envelope detection circuits 41 and 43. Referring to FIG. 12, in the envelop detection circuit 41 or 43 shown, a resistor 82 and a capacitor 83 are connected in parallel between the cathode of a diode 81 and the ground, and in order to augment the non-linearity of the diode 81 in a low signal region, the anode of the diode 81 is connected through a resistor Rb to a terminal 84 to which the bias voltage Vb is supplied. The high frequency signal S5 or S7 is inputted to a terminal 85 led out from the anode of the diode 81, and the envelope detection signal D5 or D7 is outputted from a terminal 86 led out from the cathode of the diode 81.

Figure 13:
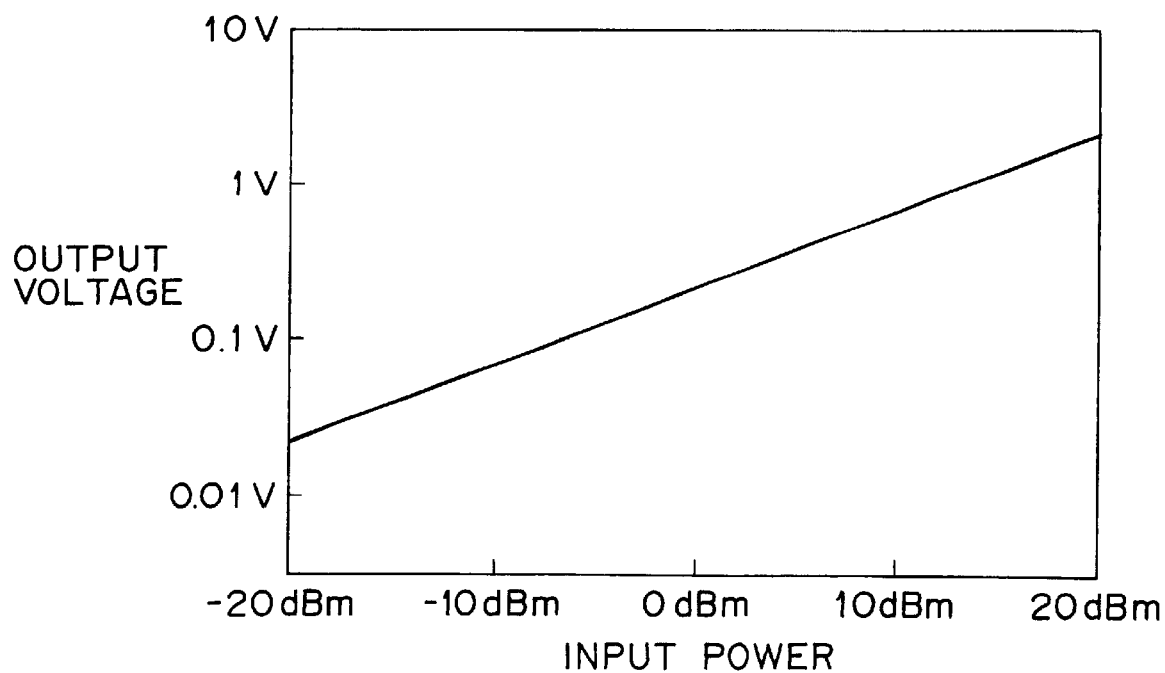
FIG. 13 is a diagram illustrating an example of a characteristic of the envelope detection circuit of FIG. 12.
Figure 14:
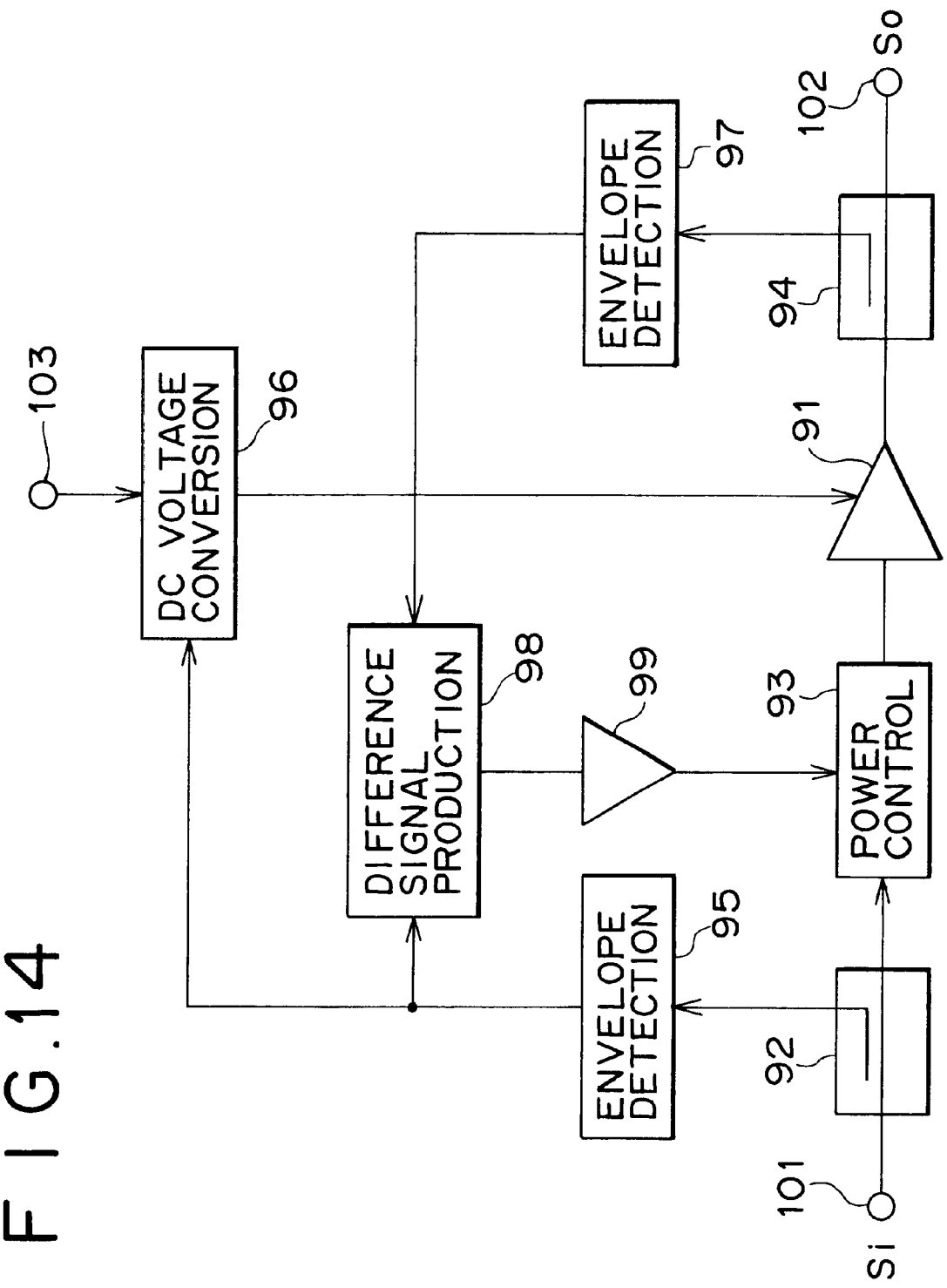
FIG. 14 is a circuit diagram showing a circuit which carries out a conventional distortion compensation method.

In the present envelop detection circuit 41 or 43, as a characteristic of an output voltage which is obtained as the envelope detection signal D5 or D7 with respect to an input power applied as the high frequency signal S5 or S7, such a characteristic as illustrated in FIG. 13 is obtained.

As described above, the high frequency power amplification section of FIG. 2 is constructed such that the input high frequency signal Si obtained at the input terminal 32 is branched to two input high frequency signals S1 and S5 by the directional coupler 33, and the high frequency signal S4 of the output of the power amplifier 31 is branched to the two output high frequency signals So and S6 by the directional coupler 36. However, it is otherwise possible to adopt such a construction that the input high frequency signal Si obtained at the input terminal 32 is supplied as it is to the gain control circuit 34 and the envelope detection circuit 41 and the high frequency signal S4 of the output of the power amplifier 31 is led out as it is as the output high frequency signal So to the output terminal 37 and supplied to the level adjustment circuit 42.

Further, in place of the construction that the level of the output high frequency signal S is adjusted on the input side of the envelope detection circuit 43, another construction may be employed wherein the level of the input high frequency signal S is adjusted on the input side of the envelope detection circuit 41.

Further, while the high frequency power amplification section of FIG. 2 is constructed such that the gain control circuit 34 is provided in a preceding stage and the addition circuit 35 is provided in a following stage on the input side of the power amplifier 31, conversely the addition circuit 35 may be provided in the preceding stage while the gain control circuit 34 is provided in the following stage.

Further, the present invention can be applied not only to a power amplifier of a transmission section of a terminal equipment of a digital portable telephone system but also widely to a power amplifier for transmission of a base station or a power amplifier of a transmission section of a base station or a mobile station of any other wireless communication system.

While a preferred embodiment of the present invention has been described using specific terms, such description is for illustrative purposes only, and it is to be understood that changes and variations may be made without departing from the spirit or scope of the following claims.

What is claimed is:

1. A distortion compensation method for compensating for a nonlinear distortion of power amplification means, comprising:

a detection step of detecting individual envelopes of an input signal and an output signal of said power amplification means;

an addition step of adding a signal corresponding to a finite difference between detection signals of the envelopes obtained by the detection step to the input signal of said power amplification means;

an extraction step of extracting a low frequency component from the signal corresponding to a finite difference; and a control step of controlling a gain of gain control means provided on an input side of said power amplification means based on the low frequency component extracted in said step of extracting.

2. A power amplification apparatus, comprising:

power amplification means;

input envelope detection means for detecting an envelope of an input signal of said power amplification means;

output envelope detection means for detecting an envelope of an output signal of said power amplification means;

finite difference detection means for producing a signal corresponding to a finite difference between an output signal of said input envelope detection means and an output signal of said output envelope detection means;

addition means for adding an output signal of said finite difference detection means to the input signal of said power amplification means;

low frequency extraction means for extracting a low frequency component from the signal outputted from said finite difference detection means; and gain control means provided on input side of said power amplification means and having a gain controlled with a low frequency component signal outputted from said low frequency extraction means.

3. The power amplification apparatus according to claim 2, wherein said addition means includes three resistors connected in a star connection.

4. A wireless communication apparatus, comprising:

a power amplification apparatus operating as a high frequency power amplification section, including:

power amplification means;

input envelope detection means for detecting an envelope of an input signal of said power amplification means;

output envelope detection means for detecting an envelope of an output signal of said power amplification means;

finite difference detection means for producing an output signal corresponding to a finite difference between an output signal of said input envelope detection means and an output signal of said output envelope detection means; and addition means for adding the output signal of said finite difference detection means to the input signal of said power amplification means;

low frequency extraction means for extracting a low frequency component from the output signal from said finite difference detection means; and gain control means provided on an input side of said power amplification means and having a gain controlled with a low frequency component signal outputted from said low frequency extraction means.

* * * * *